United States Patent [19]
Koichi

[11] Patent Number: 4,994,856
[45] Date of Patent: Feb. 19, 1991

[54] IMAGE FORMING APPARATUS

[75] Inventor: Eto Koichi, Yamatokoriyama, Japan

[73] Assignee: Sharp Kabushiki Kaisha, Osaka, Japan

[21] Appl. No.: 507,195

[22] Filed: Apr. 10, 1990

[30] Foreign Application Priority Data

Apr. 12, 1989 [JP] Japan .................................. 64-43540

[51] Int. Cl.⁵ ............................................. G03B 27/74
[52] U.S. Cl. ........................................ 355/68; 355/38; 355/27
[58] Field of Search ...................... 355/27, 28, 40, 41, 355/38, 68; 430/138

[56] References Cited

U.S. PATENT DOCUMENTS

| | | | |
|---|---|---|---|
| 4,437,742 | 3/1984 | Taniguchi | 354/21 |
| 4,782,365 | 11/1988 | Takagi | 355/38 |
| 4,951,085 | 8/1990 | Ibuchi | 355/38 |

FOREIGN PATENT DOCUMENTS 58-88739  5/1983  Japan .

Primary Examiner—Michael L. Gellner
Assistant Examiner—Khanh Dang

[57] ABSTRACT

An image forming apparatus comprises an image forming apparatus body, a media cartridge removably housed in an image forming apparatus body, the media cartridge being provided with a feeding shaft about which a media sheet consisting of a photo and pressure sensitive recording sheet and a leader sheet which are connected to each other at their one end portions is wound, and the leader sheet having an information mark positioned at a distance longer than length L away from a free end thereof for showing characteristics of the photo and pressure sensitive recording sheet, a winding shaft for winding the media sheet fed from the media cartridge, sheet detecting device disposed adjacent the winding shaft, the sheet detecting device being actuated by bringing a leader sheet into contact therewith when the free end of the leader sheet is wound about the winding shaft and mark reading device provided between the media cartridge and the winding shaft at a distance as same as the length L away from the winding shaft, for reading the information mark after actuation of the sheet detecting device.

5 Claims, 3 Drawing Sheets

IMAGE FORMING APPARATUS

BACKGROUND OF THE INVENTION

1. Field of the Invention

The present invention relates to an image forming apparatus which can set a media sheet by automatically feeding the media sheet from a feeding shaft to a winding shaft, and more particularly to an image forming apparatus provided with a mark reading device that reads an information mark provided to the media sheet and showing characteristics thereof.

2. Description of the Prior Art

Conventionally, in an image forming apparatus using a media sheet having photosensitivity and pressure sensitivity for forming images (e.g., Japanese Unexamined Patent Application No. SHO 58(1983)-88739), a media sheet not yet used is housed, by being wound onto a feeding shaft, in a media cartridge made from a shading material so as to shade the media sheet. The media cartridge is attached to an image forming apparatus body and a free end of the media sheet is automatically moved onto a winding shaft (automatic feeding) to accomplish a setting of the media sheet.

Media sheets having photosensitivity and pressure sensitivity vary in characteristics such as photosensitivity in specific manufacturing lots. To modify dispersion of the characteristics, an adjustment of an optical filter is required corresponding to the lot. Such adjustment has hitherto been made in such a manner that a mark of photosensitivity for a specific lot is marked at the free end of the media sheet and a reading device reads the mark upon the automatic feeding of media sheet so as to make adjustments accordingly.

The conventional type of reading device often makes mistakes in reading the mark, therefore the adjustment cannot be accurately performed. In detail, a media sheet is usually provided at the free end with a leader sheet portion comprising a leader sheet made from a hard material and connected therewith for simplifying the automatic feeding. The leader sheet portion which is elastic happens to go up from the reading device when its end is not wound yet, resulting in occurrence of misreading by the conventional reading device.

SUMMARY OF THE INVENTION

The present invention provides an image forming apparatus comprising:

an image forming apparatus body, a media cartridge removably housed in said image forming apparatus body, said media cartridge being provided with a feeding shaft about which a media sheet consisting of a photo and pressure sensitive recording sheet and a leader sheet which are connected to each other at their one end portions is wound, and said leader sheet having an information mark positioned at a distance longer than length L away from a free end thereof for showing characteristics of said photo and pressure sensitive recording sheet, a winding shaft removably mounted in said image forming apparatus body for winding said media sheet fed from said media cartridge, sheet detecting means disposed adjacent said winding shaft in said image forming apparatus body, said sheet detecting means being actuated by bringing a leader sheet into contact therewith when said free end of said leader sheet is wound about said winding shaft, and mark reading means provided between said media cartridge and said winding shaft at a distance equal to the length L away from the winding shaft, for reading said information mark after actuation of said sheet detecting means.

The sheet detecting means in the present invention may employ a microswitch comprising an actuator adapted to contact with the leader sheet.

Also, the mark reading means may use a so-called photosensor comprising a light emitting element for emitting light to the information mark on the leader sheet and a light receiving element for receiving light reflected from the leader sheet.

DETAILED DESCRIPTION OF THE PREFERRED EMBODIMENT

An image forming apparatus of the present invention is basically provided with means for exposing a photo and pressure sensitive recording sheet of a media sheet with an original image on a copy and pressurizing means for pressurizing the exposed photo and pressure sensitive recording sheet overlapped with an image receiving sheet coated with development material, so that a corresponding image to the original one can be formed on the image receiving sheet.

In the present invention, an information mark showing characteristics of a photo and pressure sensitive recording sheet of a media sheet is positioned at a distance longer than the length L (between a winding shaft and mark reading means) away from a free end of a leader sheet of the media sheet, so that the information mark is read after the free end reaches a winding shaft. The leader sheet, when the free end reaches the winding shaft and is wound thereon, is steadily stretched between a feeding shaft and the winding shaft, whereby the leader sheet is prevented from being remote from mark reading means and the information mark can be accurately read by the mark reading means.

Figure 2:
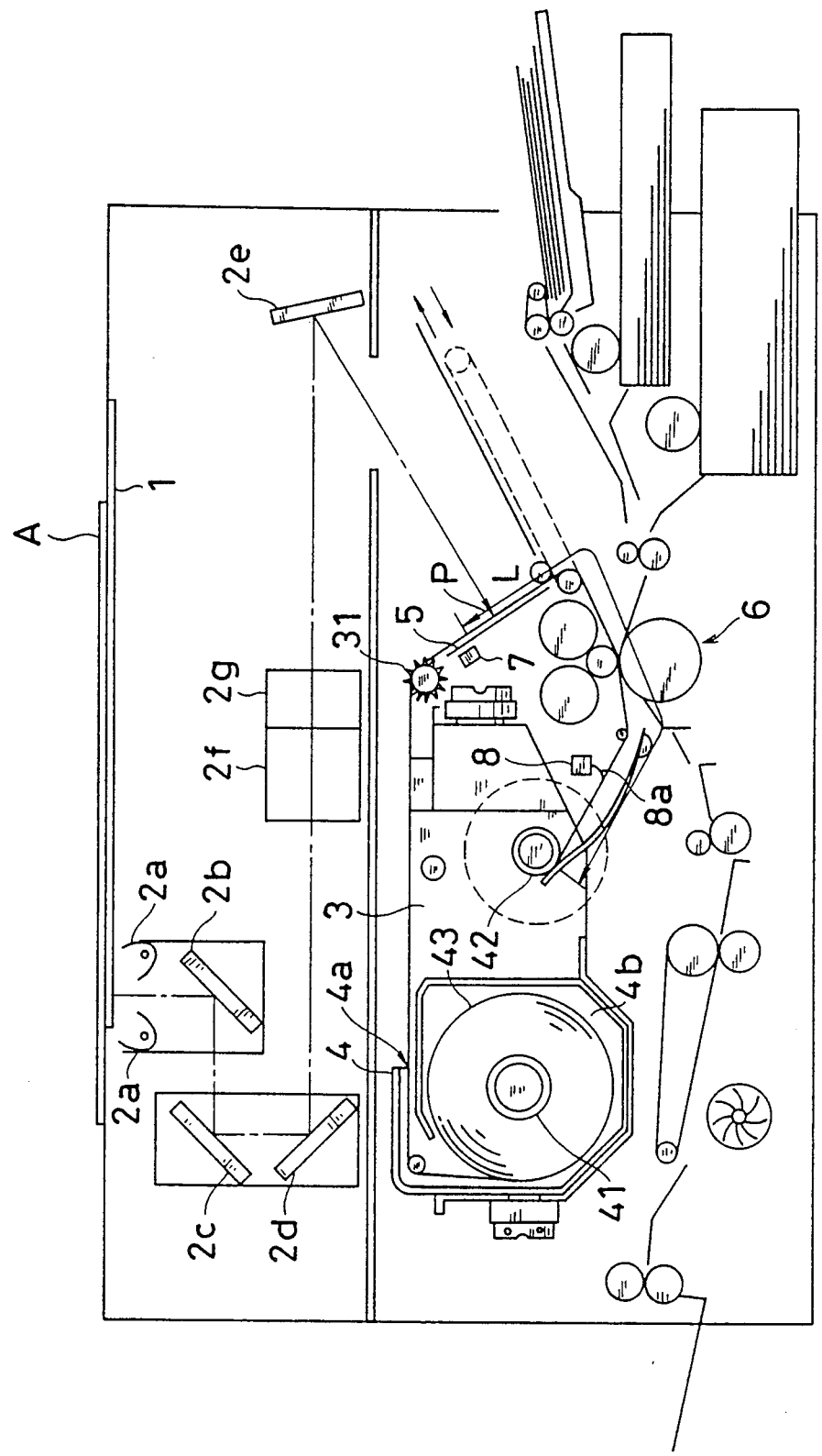
FIG. 2 is an explanatory view showing a general construction of a copying machine of the embodiment of the present invention.

FIG. 2 is a front view schematically showing a copying machine provided with an information mark reading means of an embodiment of the present invention.

A copying machine body has at the top an original table 1 which comprises a transparent hard glass and upon which an original A can be set. An optical system including light sources 2a, 2a, mirrors 2b–2e, a lens 2f, and a filter 2g is disposed below the original table 1. The optical system directs a reflecting light from the original A to an exposure point P as shown by the broken line. The filter 2g comprises a plurality of filter elements each having different spectral sensitivity and transmittance characteristics. Color adjustment of the reflecting light from the original A is made through an associative function of the filter elements. The combination of filter elements of the filter 2g can be changed corresponding to reading of an information mark 43d described later so as to provide a suitable color adjustment for specific lots of media sheet 43.

Figure 3:
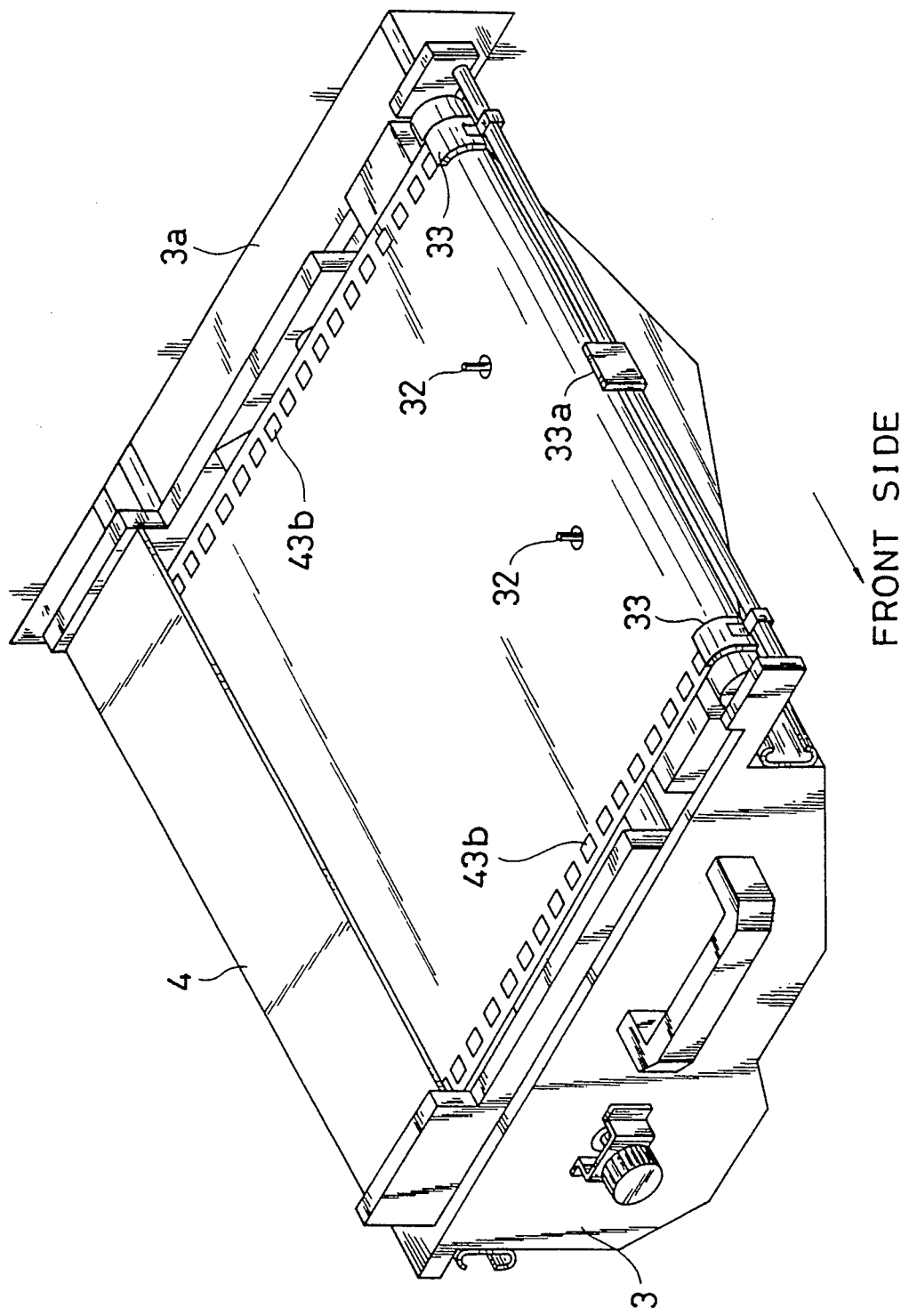
FIG. 3 is a perspective view showing a bucket accommodating therein a media cartridge of the embodiment of the present invention.

A media cartridge 4 containing the media sheet 43 is accommodated in a bucket 3. FIG. 3 is a perspective view of the bucket 3 which can be pulled out through an opening 3a formed at a front panel of the copying machine body. The media cartridge 4 can be vertically attached to and detached from the bucket 3 drawn. The media cartridge 4 has therein a feeding shaft 41 and a winding shaft 42, a media sheet 43 not yet used being wound onto the feeding shaft 41. The media cartridge 4 is made from a shading material, so that a sheet chamber 4b containing the media sheet 43 not yet used is shaded from light. The sheet chamber 4b is slitted to have an opening 4a through which the media sheet 43 is drawn out to be wound onto the winding shaft 42 through a pressure roller device 6 and other components in the copying machine body.

The bucket 3 has a tractor roller 31 at the righthand upper end. The tractor roller 31 has a pair of geared parts and engaging holes 43b are provided at both lateral ends of a leader sheet 43a of the media sheet 43 corresponding to the pair of geared parts. The bucket 3 has also guide members 33, 33 which slidably contact with the tractor roller 31 and can be turned with a knob 33a, so that when the engaging holes 43b are brought into engagement with the tractor roller 31, the guide member 33 is turned to press the leader sheet 43a with the tractor roller 31. The bucket 3 also has guide pins 32, 32, and the leader sheet 43a has guide pin holes 43c, 43c corresponding to the guide pins 32 which are adapted to engage with a projection (not shown) in the copying machine body and be moved downwardly when the bucket 3 is inserted into the copying machine body.

Figure 1:
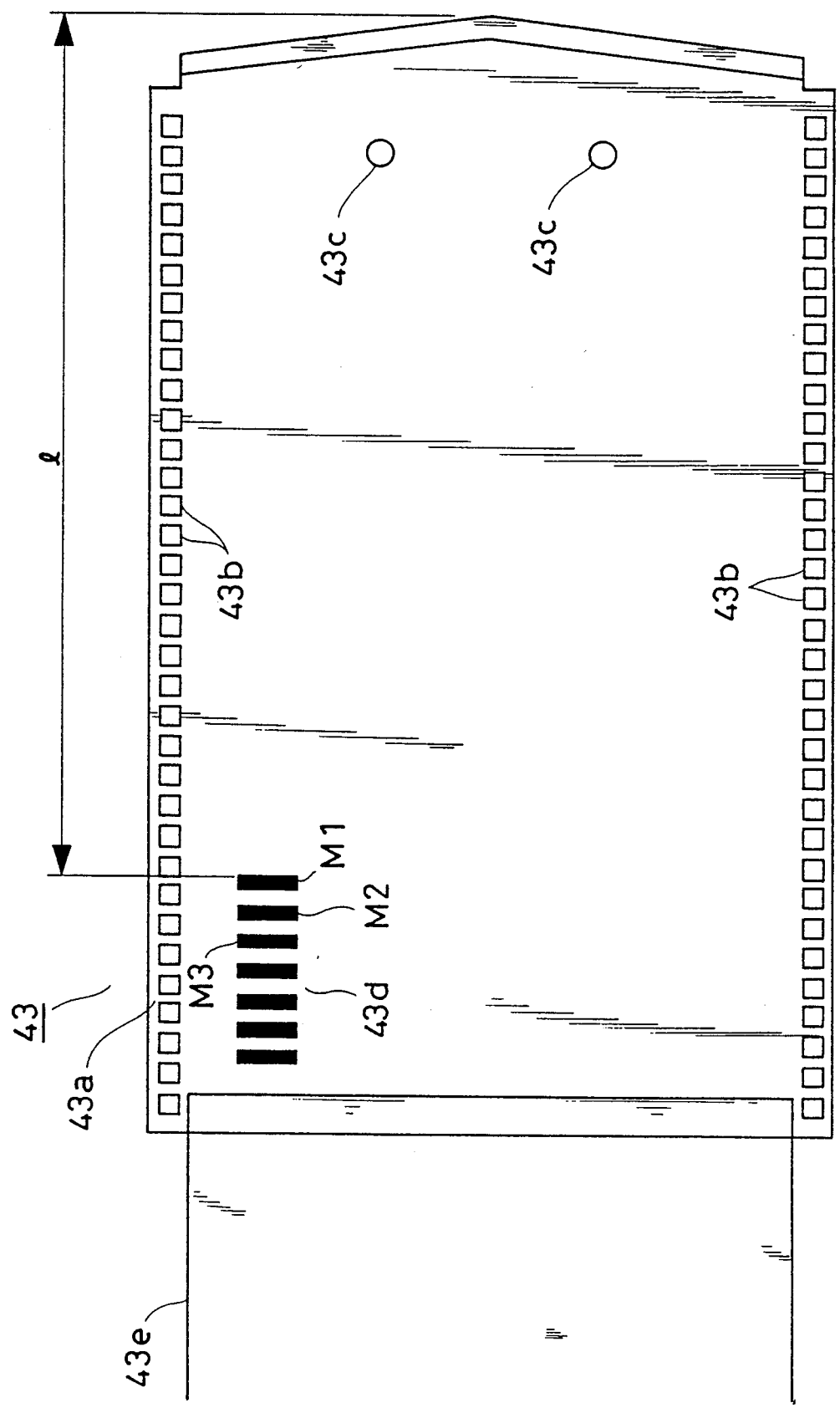
FIG. 1 is a plan showing a shape of a leader sheet of a media sheet to be used in an embodiment of the present invention.

FIG. 1 is a plan showing an end portion of the media sheet 43. The leader sheet 43a is made of a resin material having high elasticity, such as polyethylene terephthalate, and a thickness of 100 μm and a width slightly larger than a photo and pressure sensitive recording sheet 43e connected with the leader sheet 43a. The engaging holes 43b are formed at this portion of the larger width, and the guide pin holes 43c, 43c are provided near the center of the free end of the leader sheet 43a. An information mark 43d showing characteristics of the photo and pressure sensitive recording sheet 43e is positioned, in a form of bar code, on the back of the leader sheet 43a at a distance longer than the predetermined length 1 away from the free end. Alternatively, the number of the information mark may be plural, and if so, the information marks may be sequentially positioned on the leader sheet 43a.

In use, the bucket 3 is pulled out from the copying machine body and a fresh media cartridge 4 is set in the bucket. Then, the leader sheet 43a is drawn out through the opening 4a, and the holes 43b and 43c are fit to the tractor roller 31 and the guide pins 32, respectively. The leader sheet 43a is pressed to the tractor roller 31 with the guide member 33. When the bucket 3 is inserted into the copying machine body, the guide pins 32 are moved downward and the automatic feeding starts.

In the copying machine body, an exposure table 5 and the pressure roller device 6 are located at the righthand side of the bucket 3. The leader sheet 43a fit on the tractor roller 31 is wound onto the winding shaft 42 through the exposure table 5 and the pressure roller device 6 by the automatic feeding.

The winding shaft 42 has an adhesive tape fit on its surface, mounts a torque limiter (not shown) and is rotated at a higher speed than the pressure roller device 6. In the automatic feeding, when the leader sheet 43a reaches the winding shaft 42 through the pressure roller device 6, it sticks at its free end to the surface of the winding shaft 42 to be quickly wound thereon, so that the leader sheet 43a is stretched between the pressure roller device 6 and the winding shaft 42 to actuate a sheet detecting sensor 8 provided near the winding shaft 42. In this instance, the torque limiter operates to cause the winding shaft 42 to rotate idly for modifying a difference of rotational speed between the pressure roller 6 and the winding shaft 42 when the leader sheet 43a is stretched therebetween.

Upon actuation of the sheet detecting sensor 8, roller elements of the pressure roller device 6 are made to be free of pressure, and the slack in the leader sheet occurring on the way from the exposure table 5 to the pressure roller device 6 is absorbed, so that the leader sheet 43a is steadily stretched between the feeding shaft 41 and the winding shaft 42.

A mark reading device 7 is disposed at the back side of and in close proximity to the exposure table 5. The mark reading device 7 is a photo-sensor for reading the information mark 43d. The photo-sensor comprises a light emitting element, such as light emitting diode, emitting light to the leader sheet 43a, and a light receiving element, such as phototransistor, receiving light reflected from the surface of the leader sheet 43a.

The mark reading device 7 is disposed at a distance of the length L shorter than the predetermined length 1 away from the winding shaft 42 as shown, and an interval between the free end of the leader sheet 43a and the information mark 43d has a length 1 (FIG. 1) so that 1>L, i.e., is longer about 7-15 cm than L. The difference is a required length for allowing the free end of the leader sheet 43a to be wound onto the winding shaft 42. The information mark 43d synchronously reaches the mark reading device 7 when the free end of the leader sheet 43a is wound onto the winding shaft 42. The sheet detecting sensor 8 is disposed at a position where the leader sheet 43a is transmitted immediately before the winding shaft 42. The sheet detecting sensor 8 may employ a microswitch which has an actuator 8a, is turned off when the actuator contacts the media sheet 43 stretched between the feeding shaft 41 and the winding shaft 42, and is turned on when no media sheet 43 extends therebetween. After start of the automatic feeding, when the sheet detecting sensor 8 is turned off by the leader sheet 43a, the mark reading device 7 is actuated to read the information mark 43d positioned at the distance more than the length 1 away from the free end of leader sheet 43a.

The reading of the information mark 43d starts with a start mark M1 of the information mark, and the subsequent marks M2, M3, . . . are checked at a fixed time interval, the marks M1, M2, M3, . . . being arranged at a uniform interval. When any marks are present, reflecting light does not go to the receiving element of the mark reading device 7, so that in this event the result read is coded as "1". On the contrary, if there are no marks, the result read is coded as "0". Corresponding to coded values of the information mark 43d read, an adjustment value for specific lots is read out from a table stored in a memory provided on a control circuit comprising a microcomputer in the copying machine so as to carry out color adjustment. The color adjustment may be made by use of a color adjustment means as disclosd in U.S. patent application Ser. No. 378,999 (now U.S. Pat. No. 4,951,085) which was filed by the same assignee. Also, the media sheet of the present invention may employ a light receiving sheet as disclosed in the above application.

As clearly seen from the above, upon reading of the information mark 43d, the leader sheet is first wound at its end onto the winding shaft 42 and steadily stretched between the feeding shaft 41 and the winding shaft 42. Hence, the leader sheet 43a is not remote from the mark reading device 7.

Also, the present embodiment mounts the mark reading device 7 at a position nearer the feeding shaft than the pressure roller device 6 in the transmitting route of leader sheet, so that even when the leader sheet 43a is more or less curving due to operation of the pressure roller device 6, the information mark 43d is not influenced by this can be read accurately by the mark reading device.

As seen from the above, according to the present invention, reading of the information mark is carried out with the media sheet being steadily stretched. Hence, occurrence of mistakes in reading of information marks due to the leader sheet's being remote from the mark reading device can be prevented.

What is claimed is:

1. An image forming apparatus comprising:
   an image forming apparatus body;
   a media cartridge removably housed in said image forming apparatus body, said media cartridge being provided with a feeding shaft about which a media sheet consisting of a photo and pressure sensitive recording sheet and a leader sheet which are connected to each other at their one end portions is wound, and said leader sheet having an information mark positioned at a distance longer than length L away from a free end thereof for showing characteristics of said photo and pressure sensitive recording sheet;
   a winding shaft removably mounted in said image forming apparatus body for winding said media sheet fed from said media cartridge;
   sheet detecting means disposed adjacent said winding shaft in said image forming apparatus body, said sheet detecting means being actuated by bringing a leader sheet into contact therewith when said free end of said leader sheet is wound about said winding shaft; and
   mark reading means provided between said media cartridge and said winding shaft at a distance as same as the length L away from the winding shaft, for reading said information mark after actuation of said sheet detecting means.

2. An image forming apparatus according to claim 1, wherein said sheet detecting means incorporates a microswitch having an actuator adapted to contact said leader sheet.

3. An image forming apparatus according to claim 1, wherein said mark reading means comprises a light emitting element for emitting light to said information mark on said leader sheet and a light receiving element for receiving light reflected from the leader sheet.

4. An image forming apparatus according to claim 1, wherein said sheet detecting means incorporates a microswitch having an actuator adapted to contact said leader sheet, and said mark reading means comprises a light emitting element for emitting light to said information mark on said leader sheet and a light receiving element for receiving light reflected from the leader sheet.

5. An image forming apparatus according to claim 1, wherein said image forming apparatus body is copying machine body.

* * * * *